United States Patent
Mengel et al.

(10) Patent No.: US 7,348,123 B2
(45) Date of Patent: *Mar. 25, 2008

(54) PROCESS FOR PREPARING A FLEXOGRAPHIC PRINTING PLATE

(75) Inventors: Christoph Mengel, Mainz (DE); Dietmar Dudek, Langen (DE); Mark A Hackler, Ocean, NJ (US); Anandkumar Ramakrishnan Kannurpatti, East Windsor, NJ (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/580,666

(22) Filed: Oct. 13, 2006

(65) Prior Publication Data

US 2007/0037097 A1    Feb. 15, 2007

Related U.S. Application Data

(63) Continuation of application No. 10/258,312, filed on Oct. 18, 2002, now Pat. No. 7,122,295.

(51) Int. Cl.
*G03F 7/34* (2006.01)
*G03F 7/14* (2006.01)

(52) U.S. Cl. .................. 430/254; 430/306; 430/309; 430/325; 430/330

(58) Field of Classification Search ............ 430/270.1, 430/306, 309, 330, 348, 401, 413, 494, 944, 430/945, 281.1, 288.1, 254, 325; 433/434; 101/453, 463.1

See application file for complete search history.

(56) References Cited

U.S. PATENT DOCUMENTS

| | | | |
|---|---|---|---|
| 3,060,023 A | 10/1962 | Burg et al. | |
| 3,060,024 A | 10/1962 | Burg et al. | |
| 3,060,025 A | 10/1962 | Burg et al. | |
| 3,264,103 A | 8/1966 | Cohen et al. | |
| 5,015,556 A | 5/1991 | Martens | |
| 5,175,072 A | 12/1992 | Martens | |
| 5,187,044 A | 2/1993 | Prioleau et al. | |
| 5,215,859 A | 6/1993 | Martens | |
| 5,262,275 A | 11/1993 | Fan | |
| 5,279,697 A | 1/1994 | Peterson et al. | |
| 5,719,009 A | 2/1998 | Fan | |
| 6,171,758 B1 | 1/2001 | Bhateja et al. | |
| 6,238,837 B1 | 5/2001 | Fan | |
| 7,122,295 B2 * | 10/2006 | Mengel et al. | ............ 430/306 |
| 2002/0009672 A1 | 1/2002 | Daems et al. | |
| 2002/0197540 A1 | 12/2002 | Goodin et al. | |
| 2003/0180655 A1 | 9/2003 | Fan et al. | |

FOREIGN PATENT DOCUMENTS

| | | |
|---|---|---|
| EP | 0468667 A2 | 1/1992 |
| EP | 0665469 A2 | 8/1995 |
| EP | 0665471 A2 | 8/1995 |
| EP | 0469735 B1 | 6/1998 |
| EP | 0468745 B1 | 10/1999 |
| WO | WO 98/13730 A1 | 4/1998 |
| WO | WO 01/18604 A2 | 3/2001 |

\* cited by examiner

*Primary Examiner*—Richard L. Schilling
(74) *Attorney, Agent, or Firm*—Thomas H. Magee

(57) ABSTRACT

A flexographic printing plate is prepared from a photosensitive element having a photopolymerizable elastomeric layer with specific rheological properties. The element is imagewise exposed and thermally treated to form a relief structure suitable for flexographic printing.

37 Claims, No Drawings

PROCESS FOR PREPARING A FLEXOGRAPHIC PRINTING PLATE

BACKGROUND OF THE INVENTION

1. Field of the Invention

This invention pertains to a method for preparing flexographic printing plates and, in particular, a method for thermally treating a photosensitive element to form a relief structure suitable for flexographic printing.

2. Description of Related Art

Flexographic printing plates are well known for use in printing surfaces which range from soft and easy to deform to relatively hard, such as packaging materials, e.g., cardboard, plastic films, aluminum foils, etc. Flexographic printing plates can be prepared from photopolymerizable compositions, such as those described in U.S. Pat. Nos. 4,323,637 and 4,427,759. The photo-polymerizable compositions generally comprise an elastomeric binder, at least one monomer and a photoinitiator. Photosensitive elements generally have a layer of the photopolymerizable composition interposed between a support and a coversheet or a multilayer cover element. Upon imagewise exposure to actinic radiation, polymerization, and hence photocuring (insolubilization) of the photo-polymerizable layer occurs in the exposed areas. Conventionally, the element is treated with a suitable solution, e.g., solvent or aqueous-based washout, to remove the unexposed areas of the photopolymerizable layer leaving a printing relief which can be used for flexographic printing.

However, developing systems that treat the element with a solution are time consuming since drying for extended period (0.5 to 24 hours) is necessary to remove entrained developer solution. In addition, these developing systems produce potentially toxic by-product wastes (both the solvent and any material carried off by the solvent) during the development process.

To avoid the problems with solution development, a "dry" thermal development process may be used. In a thermal development process, the photosensitive layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. Nos. 3,060,023 (Burg et al.); 3,264,103 (Cohen et al.); 5,015,556 (Martens); 5,175,072 (Martens); 5,215,859 (Martens); and 5,279,697 (Peterson et al.). The exposed portions of the photosensitive layer remain hard, that is do not soften or melt, at the softening temperature for the unexposed portions. The absorbent material collects the softened un-irradiated material and then is separated/removed from the photosensitive layer. The cycle of heating and contacting the photosensitive layer may need to be repeated several times in order to sufficiently remove the flowable composition from the un-irradiated areas and form a relief structure suitable for printing. Thus remains a raised relief structure of irradiated, hardened composition that represents the irradiated image.

The photosensitive compositions suitable for use in thermal development process as disclosed by Martens in the above citations primarily are radiation curable polyurethane elastomers. Martens discloses that the polyurethane elastomer have a melt transition temperature of less than 180° C. and a melt index of at least 0.5 grams/minute at 180° C., and, that the melt indices of molten radiation crosslinkable elastomeric compositions when measured according to ASTM No. D 1238-70 should be in the range of 0.5 grams/minute to 10.0 grams/minute in the temperature range from 100° C. to 180° C.

In U.S. Pat. No. 5,215,859 Martens also discloses that commercially available flexographic printing plates, e.g., DuPont PLS, can be used in a dry development process for preparing printing plates. (Commercially available plates, such as PLS are prepared using conventional solution, e.g., solvent, washout processes to form the relief.) However, a PLS plate had poor clean out, i.e., removal of polymer, of the uncured portions, i.e., poor relief depth, upon thermal development and also distortion of fine printing elements and highlight dots could be seen. In order to improve the removal of the polymer (clean out) of the uncured portions without extending the development time, the development temperature was raised. But raising of the development temperature caused even more severe distortion of the fine image elements of the plate and/or polymeric base support for the plate.

So a problem arises with the use of conventional and/or prior art flexographic printing elements in a thermal development process for preparing printing plates in that cleanout of uncured portions is insufficient to form a relief suitable for quality printing of highlight dots and fine lines. Efforts to improve the clean out of these elements are counter to the desired performance of the system and plate. Increasing number of cycles of heating and contacting of the photosensitive layer is counter to maintaining the productivity of the thermal development system. Increasing the temperature to heat the photosensitive element and to cause the uncured portions of the layer to melt or flow more readily may be contrary to maintaining dimensional integrity of the element.

SUMMARY OF THE INVENTION

It is an object of the present invention to provide a process for preparing flexographic printing plates using a dry thermal development step.

It is another object of the present invention to provide a photosensitive element in which uncured portions of the element can readily be removed by thermal treatment to provide a relief suitable for quality printing of highlight dots and fine lines.

It is yet another object of the present invention to provide a photosensitive element in which cured portions are sufficiently hardened so as not to distort and can withstand the rigorous conditions of thermal processing to provide a relief suitable for quality printing of highlight dots and fine lines.

In accordance with this invention there is provided a process for producing a flexographic printing plate comprising providing a photosensitive element having a photopolymerizable elastomeric layer on a support; imagewise exposing the element to actinic radiation to polymerize areas exposed to radiation; and thermally treating the element to remove unpolymerized material from the element and form a relief surface. The photosensitive element useful in the present process includes a photopolymerizable elastomeric layer having a composition comprising at least one thermoplastic binder; at least one compound capable of addition polymerization; and a photoinitiator; wherein the layer has a melt flow index of at least 4 grams/10 min. under a 2.16 kilogram weight at 140° C., and wherein the layer when exposed to actinic radiation to determine a log-log plot of the dynamic storage modulus (G') versus frequency (f), exhibits a slope of less than 0.18.

In accordance with another aspect of this invention there is provided a process for producing a flexographic printing plate comprising providing a photosensitive element having a photopolymerizable elastomeric layer on a support; imagewise exposing the photopolymerizable layer to actinic radiation through an in-situ mask in the presence of atmospheric oxygen to polymerize areas exposed to radiation; and thermally treating the element to remove unpolymerized material from the element and form a relief surface. The photosensitive element useful in the present process includes on the support at least one photopolymerizable elastomeric layer having a composition comprising at least one thermoplastic binder; at least one compound capable of addition polymerization; and a photoinitiator; wherein the layer when exposed to actinic radiation to determine a log-log plot of the dynamic storage modulus (G') versus frequency (f), exhibits a slope of less than 0.20.

DESCRIPTION OF THE PREFERRED EMBODIMENT(S)

The process of the present invention prepares a flexographic printing plate from a photosensitive element having specific rheological properties and includes the steps of imagewise exposing, and thermally treating with an absorbent material to form a relief surface. The photosensitive element with the specific rheological properties and limitations is able to withstand the conditions associated with thermal processing and provide good removal of the uncured portions (clean out) to provide a relief surface suitable for high quality flexographic printing. In addition, the photosensitive element used in the present process is able to reproduce the fine picture elements from the desired image without distortion. Such a photosensitive element with the specific rheological properties will allow one to use processing conditions that will not be detrimental to the fine features of the plate and/or a support for the element. In addition, these photopolymerizable elastomeric layers useful in this invention can be effectively processed in fewer cycles of heating and contacting and/or at lower temperatures.

The first step of the present process is to provide a photosensitive element. The photosensitive element comprises a photopolymerizable elastomeric layer on a support. As used herein, the term "photopolymerizable" is intended to encompass systems that are photopolymerizable, photocrosslinkable, or both. The photopolymerizable elastomeric layer is formed of a composition comprising a thermoplastic binder, at least one monomer and an initiator, where the initiator is sensitive to actinic radiation, preferably UV radiation. The thermoplastic binder preferably is elastomeric.

The thermoplastic binder can be a single polymer or mixture of polymers. Binders include natural or synthetic polymers of conjugated diolefin hydrocarbons, including polyisoprene, 1,2-polybutadiene, 1,4-polybutadiene, and butadiene/acrylonitrile. Preferably, the thermoplastic binder is an elastomeric block copolymer of an A-B-A type block copolymer, where A represents a non-elastomeric block, preferably a vinyl polymer and most preferably polystyrene, and B represents an elastomeric block, preferably polybutadiene or polyisoprene. Most preferred thermoplastic elastomeric binders are poly(styrene/isoprene/styrene) block copolymers. The non-elastomer to elastomer ratio in the A-B-A block copolymer is preferably in the range of from 10:90 to 35:65. It is preferred that the binder be present in an amount of at least 60% by weight of the photosensitive layer.

The photopolymerizable elastomeric composition contains at least one compound capable of addition polymerization that must be compatible with the binder to the extent that a clear, non-cloudy photosensitive layer is produced. The at least one compound capable of addition polymerization may also be referred to as a monomer and can be a single monomer or mixture of monomers. Monomers that can be used in the elastomeric composition are well known in the art and include but are not limited to addition-polymerization ethylenically unsaturated compounds with at least one terminal ethylenic group. Generally the monomers have relatively low molecular weights (less than about 30,000). Preferably, the monomers have a relatively low molecular weight less than about 5000. Examples of suitable monomers include, but are not limited to, t-butyl acrylate, lauryl acrylate, the acrylate and methacrylate mono- and poly-esters of alcohols and polyols such as alkanols, such as hexanediol diacrylate and hexanediol dimethacrylate; alkylene glycols, such as ethylene glycol diacrylate, ethylene glycol dimethacrylate, and diethylene glycol diacrylate; trimethylol propane, such as trimethylol propane triacrylate; ethoxylated trimethylol propane; pentaerythritol; dipentaerythritol; polyacrylol oligomers, and the like. If a polyacrylol oligomer is used, the oligomer should preferably have a molecular weight greater than 1000. A mixture of monofunctional and multifunctional acrylates or methacrylates may be used. Other examples of suitable monomers include acrylate and methacrylate derivatives of isocyanates, esters, epoxides and the like. Additional examples of monomers include, but are not limited to, acrylated liquid polyisoprenes, acrylated liquid polybutadienes, liquid polyisoprenes with high vinyl content, and liquid polybutadienes with high vinyl content, (that is, content of 1,2-vinyl groups is greater than 20% by weight). Further examples of monomers can be found in Chen U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315. The compound capable of addition polymerization (monomer) is present in at least an amount of 5%, preferably 10 to 20%, by weight of the elastomeric composition.

The photosensitive elastomeric layer includes a photoinitiator. The photoinitiator is a compound that generates free radicals upon exposure to actinic radiation. Any of the known classes of photoinitiators, particularly free radical photoinitiators such as quinones, benzophenones, benzoin ethers, aryl ketones, peroxides, biimidazoles, benzyl dimethyl ketal, hydroxyl alkyl phenyl acetophone, and dialkoxy actophenone, may be used. Alternatively, the photoinitiator may be a mixture of compounds, one of which provides the free radicals when caused to do so by a sensitizer activated by radiation. Preferably, the initiator will be sensitive to visible or ultraviolet radiation.

Additional additives to the photopolymerizable elastomeric layer include colorants, processing aids, antioxidants, and antiozonants. Processing aids may be such things as low molecular weight polymers compatible with the elastomeric block copolymer, such as low molecular weight alpha-methylstyrene polymer or copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

Surprisingly it has been found that the photopolymerizable elastomeric layer needs to be in a particular range of certain rheological properties to ensure the generation of a desired relief and also good printing performance after thermal treatment. Under certain process situations, particularly when imagewise exposed with a conventional phototool, the photopolymerizable elastomeric layer should have a melt flow index of at least 4 grams/10 minutes at 140° C. with a 2.16 kg force. Additionally, the photopolymerizable elastomeric layer, when exposed as a 1 mm thick layer with an energy of 600 to 1000 mJoules/cm$^2$, should exhibit the property that a log-log plot of the dynamic storage modulus (G') versus the frequency of oscillation in a frequency range from 1.6 to 50 Hz measured at 140° C.±2° C. in a parallel plate geometry with a diameter of 30 millimeters, is linear with a slope of less than 0.18. The measurement is conducted with constant stress and a torque amplitude of 5 milliNewton-meter. The error associated with such measurement and calculation of the slope of G' is about plus or minus 0.02. Hereinafter, the slope of the log-log plot of the dynamic storage modulus, G', and the frequency will be referred to as, the slope of G'. Preferably, when the photosensitive element is imagewise exposed with a conventional phototool, the photopolymerizable elastomeric layer has a melt flow index of at least 5 grams/10 minutes at 140° C. with a 2.16 kg force and a slope of G' less than 0.18. Further preferred is that the photopolymerizable elastomeric layer has a melt flow index of at least 5 grams/10 minutes at 140° C. with a 2.16 kg force and a slope of G' of less than 0.16. More preferably, the photopolymerizable layer has a melt flow index greater than 7.5 grams/10 minutes at 140° C. with 2.16 kg force and a slope of G' less than 0.16. Most preferably, the photopolymerizable elastomeric layer has a melt flow index greater than 10 grams/10 minutes at 140° C. with 2.16 kg force and a slope of G' less than 0.14.

The melt flow index, which may also be termed melt index, is an easily accessible method to describe and compare viscous properties of a thermoplastic polymer at a specified temperature and pressure (shear rate). Specifically for the present invention, the melt flow index (MFI) is the number of grams of the photopolymerizable material at 140° C. that can be forced through a 0.0825 inch (2.0955 mm) orifice in 10 minutes by a 2.16 kg force. Measurement of the melt flow index of a polymeric material can be determined according to ASTM No. D 1238-98. The photopolymerizable elastomeric material that is easier to melt or flow at a given temperature has a higher melt flow index than another material that is more difficult to melt or flow at the same temperature. That is, the higher melt flow index the less resistance the material has to flow or melt. For the invention described here, a high melt flow index (MFI greater than 4 grams/10 minutes at 140° C. with 2.16 kg force) offers the possibility to operate at milder process conditions during the thermal development.

The slope of G' is a determination of the degree of the mechanical strength associated with a photopolymerizable material at a given set of conditions. The slope of G' is the linear regression of the relationship between the logarithm of the dynamic storage modulus, G' and the logarithm of the frequency, f, measured in Hz. The storage modulus, G', describes the solid behavior of a polymer. The frequency, f, is the frequency of oscillation, in which shear is applied to the sample expressed in Hz. For crosslinked systems, the relationship of the storage modulus, G', and the frequency, f, on a log-log plot shows a linear relationship over a relatively wide frequency range. At the gel point which is where the viscosity of the melt reaches infinity, the storage modulus, G', and the loss modulus, G", increase proportionally to the square root of the frequency f and thus have a slope of m=0.5. The storage modulus, G', of totally crosslinked systems is independent of the frequency f over a wide frequency range and thus has a slope of zero (m=0). The dynamic measurement of the viscoelastic nature of crosslinked polymeric systems and properties including the storage modulus, G', and the frequency, f, are described by M. Pahl, W. Gleißle, H. M. Laun, *Praktische Rheologie der Kunststoffe und Elastomere*, VDI Verlag, Düsseldorf, 1991; by H. H. Winter, F. Chambon, *J. Rheol.* 30, 367 (1986); and by J. D. Ferry: *Viscoelastic Properties of Polymers*, 3$^{rd}$ edition, New York, John Wiley & Sons, 1980.

Thus the slope of the curve can be regarded as a means to quantify mechanical strength of crosslinked polymeric systems towards deformation or shear. So that in a log-log plot of the storage modulus G' and the frequency f, photopolymeric materials having a high mechanical strength or resistance to shear will have a small slope (approaching m=0) while weaker crosslinked systems will have higher values of the slope (approaching m=0.5). The log-log plot of the storage modulus, G', and frequency, f, may deviate from linear behavior at lower frequencies. Thus, linear regression to extract the slope, m, should be conducted at the higher frequencies where the plot follows a generally linear trend. In the present invention, the slope, m, of a photosensitive element has been determined in the frequency range of 1.6 to 50 Hz where the linear approximation is valid.

It has been surprisingly found that photosensitive elements, which undergo the process of thermal development to form a relief structure, need to have high mechanical strength, that is, resistance towards shear or deformation. The slope of G' is an indicator of the mechanical strength of the exposed areas of the element. Mechanical strength of the element is particularly critical for the highlight dots, isolated lines, and fine lines in the exposed areas since these photosensitive elements undergo certain shear forces at elevated temperatures during thermal processing. In order to avoid distortion and even breakage of the fine features, the photopolymerizable material must be resistant to shear and/or deformation in the cured state. As a means to quantify the mechanical strength of a photopolymerizable material, the slope of G' obtained through linear regression of the curve of the storage modulus, G', versus frequency, f, in a log-log plot at a particular temperature is used. Preferred temperature for the test is between 120 to 150° C., most preferably 140° C. Since the slope of G' is an indicator of the mechanical strength associated with a particular photopolymerizable material in the exposed state, the photopolymerizable material is exposed prior to evaluating the storage modulus, G', relative to the frequency, f. The preferred exposure energy suitable to expose a 1 mm thick plate of the photopolymerizable material is about 600 to 1000 mJoules/cm$^2$, most preferably 800 mJ/cm$^2$. The same type of radiation that is used to imagewise expose the photosensitive element is used to expose the photopolymerizable material for determining the slope of G'. Preferably the actinic radiation is ultraviolet radiation with a wavelength of 340 to 380 nm.

An unexpected exception to the elastomeric layer having the melt flow index of at least 4 grams/10 minutes at 140° C. with a 2.16 kg force and a slope of G' less than 0.18, occurs when the photosensitive element includes an in-situ mask as described below and is imagewise exposed through the in situ mask, preferably in the presence of atmospheric oxygen, and is thermally treated. In this case, it has been found that the melt flow index is no longer a limiting factor and photosensitive elements having the elastomeric layer with melt flow indices lower the 4 gram/10 minute develop well in the thermal process. Clearly to be thermally processible, a plate must have a non-zero melt flow index, and thus a melt flow index greater than 0.5 gram/10 minutes when measured as described in the preceding sections is preferred. In addition, milder thermal processing conditions may be used for photosensitive elements imagewise exposed through the in-situ mask. Thus, photosensitive elements having the elastomeric layer with a slope of G' (measured as described previously) as high as 0.2 can be processed successfully without deformation of fine image elements. Example 3 and Comparative Examples 3A-3C elucidate these findings.

The photopolymerizable elastomeric composition is capable of partially liquefying upon thermal development. That is, during thermal development the uncured elastomeric composition must soften or melt or flow at a reasonable processing or developing temperature but not be subject to cold flow, i.e., dimensional change, during normal storage.

The thickness of the photopolymerizable layer can vary over a wide range depending upon the type of printing plate desired, for example from about 0.005 inches to about 0.250 inches or greater (about 0.013 cm to about 0.64 cm or greater). The photosensitive element can include more than one photo-polymerizable elastomeric layers of the same, similar, different photo-polymerizable elastomeric composition provided that the element has the desired properties as described below.

The photopolymerizable layer itself can be prepared in many ways by mixing the binder, monomer, initiator and other ingredients. It is preferred that the photopolymerizable mixture be formed into a hot melt and then calendered to the desired thickness. An extruder can be used to perform the functions of melting, mixing, deaerating, and filtering the composition. The extruded mixture is then calendered between the support and a coversheet. Alternatively, the photopolymerizable material can be placed between the support and the coversheet in a mold. The layers are then pressed flat by the application of heat and/or pressure. A bilayer or multilayer photopolymerizable layer can be made by laminating using conventional techniques, or by co-extrusion (see U.S. Pat. No. 5,049,478).

The support can be any flexible material that is conventionally used with photosensitive elements used to prepare flexographic printing plates. Examples of suitable support materials include polymeric films such as those formed by addition polymers and linear condensation polymers, transparent foams and fabrics such as fiberglass, and metals such as aluminum, steel, and nickel or a composite thereof. A preferred support is a polyester film; particularly preferred is polyethylene terephthalate. The support typically has a thickness from 0.002 to 0.010 inch (0.0051 to 0.025 cm), with a preferred thickness of 0.003 to 0.008 inch (0.0076 to 0.020 cm). The support may be in sheet form or in cylindrical form, such as a sleeve. Flexible sleeves made of polymeric films are preferred, as they typically are transparent to ultraviolet radiation and thereby accommodate backflash exposure for building a floor in the cylindrical printing element. The sleeve may be formed from single layer or multiple layers of flexible material. Multiple layered sleeves may include an adhesive layer or tape between the layers of flexible material. Preferred is a multiple layered sleeve as disclosed in U.S. Pat. No. 5,301,610. The sleeve typically has a wall thickness from 10 to 80 mils (0.025 to 0.203 cm) or more. Other examples of supports suitable for use in the element are disclosed by Bass et al. in U.S. Pat. No. 3,146,709 and by Hoage et al. in U.S. Pat. No. 4,903,597.

The support may optionally bear a subbing layer of an adhesive material or primer to facilitate the adherence of the photopolymerizable layer to the support. Alternatively, the support may be flame-treated or electron-treated, e.g., corona treated. The treatment or primer layer is particularly useful when the support is formed of a polymeric film.

The present photosensitive printing element may further comprise one or more additional layers on the at least one photopolymerizable layer. Additional layers on the photopolymerizable layer include release layer, an actinic radiation opaque layer, a barrier layer, and a layer which alters the surface characteristics of the photosensitive element. One additional layer may provide multiple functions for the photosensitive element. One or more of the additional layers can cover the photopolymerizable layer. If the actinic radiation opaque layer is present, at least one barrier layer may be interposed between the photopolymerizable layer and the radiation opaque layer. If present, the barrier layer minimizes migration of materials between the photopolymerizable layer and the radiation opaque layer. Monomers and plasticizers can migrate over time if they are compatible with the materials in an adjacent layer. Such migration can occur, for example, from the photopolymerizable layer into the radiation opaque layer. In such instances, the infrared sensitivity of the radiation opaque layer may be altered. In addition, such migration can cause smearing and tackifying of the radiation opaque layer after imaging.

Since the surface of the photopolymerizable layer may be tacky, a release layer having a substantially non-tacky surface can be applied to the surface of the photopolymerizable layer opposite the support. Such release layer can protect the surface of the photopolymerizable layer from being damaged during removal of an optional temporary coversheet and can ensure that the photopolymerizable layer does not stick to the coversheet. During image exposure, the release layer can prevent the image-bearing mask, i.e., phototool, from binding with the photopolymerizable layer. The release layer is insensitive to actinic radiation. The release layer must be flexible, transparent, and nontacky. A thin layer, preferably having a thickness of at least 0.5 microns, but less than 10 microns, more preferably less than 4 microns, is suitable. The release layer preferably is removable by contact with an absorbent material in the range of acceptable developing temperatures for the flexographic printing element used. Examples of suitable materials for the release layer are well known in the art, and include polyamides, polyvinyl alcohol, hydroxyalkyl cellulose, copolymers of ethylene and vinyl acetate, amphoteric interpolymers, and combinations thereof. An example of a suitable release layer is disclosed by Wang in EP 0 665 471. The release layer is also suitable as a first embodiment of the barrier layer which is optionally interposed between the photopolymerizable layer and the actinic radiation opaque layer.

The photosensitive printing element may further include the actinic radiation opaque layer disposed above a surface of the photopolymerizable layer opposite the support. The actinic radiation opaque layer may substantially cover the surface or only cover an imageable portion of the photopolymerizable layer. The actinic radiation opaque layer is substantially opaque to actinic radiation and preferably is sensitive to infrared radiation. The actinic radiation opaque layer can be used with or without the barrier layer. If used with the barrier layer, the barrier layer is disposed between the photopolymerizable layer and the radiation opaque layer. The actinic radiation opaque layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which includes, but is not limited to, self-oxidizing polymers, non-self-oxidizing polymers, thermochemically decomposable polymers, polymers and copolymers of butadiene and isoprene with styrene and/or olefins, pyrolyzable polymers, amphoteric interpolymers, polyethylene wax, materials conventionally used as the release layer described above, and combinations thereof. The thickness of the infrared-sensitive layer should be in a range to optimize both sensitivity and opacity, which is generally from about 20 Angstroms to about 50 micrometers. The actinic radiation opaque layer should have a transmission optical density of greater than 2.0 in order to effectively block actinic radiation and the polymerization of the underlying photopolymerizable layer.

The actinic radiation opaque layer is employed in digital direct-to-plate image technology in which laser radiation, typically infrared laser radiation, is used to form a mask of the image for the photosensitive element (instead of the conventional image transparency or phototool). Digital methods create a mask image in-situ on or disposed above the photopolymerizable layer with laser radiation. Digital methods of creating the mask image require one or more steps to prepare the photosensitive element prior to imagewise exposure. Generally, digital methods of in-situ mask formation either selectively remove or transfer the radiation opaque layer, from or to a surface of the photosensitive element opposite the support. The method by which the mask is formed with the radiation opaque layer on the photosensitive element is not limited. The photosensitive element may include the actinic radiation opaque layer disposed above and covers or substantially covers the entire surface of the photopolymerizable layer. In this case the infrared laser radiation imagewise removes, i.e., ablates or vaporizes, the radiation opaque layer and forms an in-situ mask as disclosed by Fan in U.S. Pat. No. 5,262,275; Fan in U.S. Pat. No. 5,719,009; Fan in EP 0 741 330 A1; and Van Zoeren in U.S. Pat. Nos. 5,506,086 and 5,705,310. A material capture sheet adjacent the radiation opaque layer may be present during laser exposure to capture the material as it is removed from the photosensitive element as disclosed by Van Zoeren in U.S. Pat. No. 5,705,310. Only the portions of the radiation opaque layer that were not removed from the photosensitive element will remain on the element forming the in-situ mask.

In another digital method of mask formation, the photosensitive element will not initially include the actinic radiation opaque layer. A separate element bearing the radiation opaque layer will form an assemblage with the photosensitive element such that the radiation opaque layer is adjacent the surface of the photosensitive element opposite the support, which is typically is the photopolymerizable layer. (If present, a coversheet associated with the photosensitive element typically is removed prior to forming the assemblage.) The separate element may include one or more other layers, such as ejection layers or heating layers, to aid in the digital exposure process. Hereto, the radiation opaque layer is also sensitive to infrared radiation. The assemblage is exposed imagewise with infrared laser radiation to selectively transfer or selectively alter the adhesion balance of the radiation opaque layer and form the image on or disposed above the photopolymerizable layer as disclosed by Fan et al. in U.S. Pat. No. 5,607,814; and Blanchett in U.S. Pat. Nos. 5,766,819; 5,840,463; and EP 0 891 877 A. As a result of the imagewise transfer process, only the transferred portions of the radiation opaque layer will reside on the photosensitive element forming the in-situ mask.

It is also contemplated that digital mask formation can be accomplished by imagewise application of the radiation opaque material in the form of inkjet inks. Imagewise application of an ink-jet ink can be directly on the photopolymerizable layer or disposed above the photopolymerizable layer on another layer of the photosensitive element. Another contemplated method that digital mask formation can be accomplished is by creating the mask image of the radiation opaque layer on a separate carrier and then transferring with application of heat and/or pressure to the surface of the photopolymerizable layer opposite the support. The photopolymerizable layer is typically tacky and will retain the transferred image. The separate carrier can then be removed from the element prior to imagewise exposure. The separate carrier may have a radiation opaque layer that is imagewise exposed to laser radiation to selectively remove the radiation opaque material and form the image.

It is also possible to use more than one additional layers or types of layer. The exact choice of additional layer(s) will depend on the nature of the photopolymerizable layer, whether or not the actinic radiation opaque layer is present, the nature of the radiation opaque layer and other physical requirements of the photosensitive element.

The photosensitive element may also include a protective coversheet on the side opposite the support, that is, the top of the photopolymerizable elastomeric layer or release layer.) Examples of suitable materials for the coversheet include thin films of polyester, polystyrene, polyethylene, polypropylene, fluoropolymers and the like.

Infrared laser exposure for forming the in-situ mask from the actinic radiation opaque layer can be carried out using various types of infrared lasers, which emit in the range 750 to 20,000 nm. Infrared lasers including diode lasers emitting in the range 780 to 2,000 nm and Nd:YAG lasers emitting at 1064 nm are preferred. A preferred apparatus and method for infrared laser exposure to imagewise remove the actinic radiation opaque layer from the photosensitive element is disclosed by Fan et al. in U.S. Pat. Nos. 5,760,880 and 5,654,125. The in-situ mask images remain on the photosensitive element for subsequent steps of overall exposure to actinic radiation and may optionally remain on for thermal treating. The next step in the process of the invention is to overall expose the photosensitive element to actinic radiation through a mask to imagewise expose the photopolymerizable layer. The mask can be a phototool, that is, a film bearing an image of opaque areas and transparent areas, or an in-situ image formed from the actinic radiation opaque layer disposed above the photopolymerizable layer. Portions of the photopolymerizable elastomeric layer that are exposed to radiation chemically crosslink and cure. Portions of the photopolymerizable elastomeric layer that are blocked from exposure to the radiation remain uncured. The cured irradiated portions are not able to melt, even at elevated temperatures, and are insoluble in flexographic printing inks under normal conditions. "Normal" conditions include flexographic plate temperatures of between about 12° C. and 31° C. The portions of the composition layer that are unirradiated (unexposed) are not cured have a lower melting temperature than the cured irradiated portions. After imagewise exposure of the photosensitive element with the phototool, the phototool is removed prior to thermal treating of the photosensitive element. For photosensitive elements having the in-situ mask image, the mask is preferably removed during thermal treating, but can be removed in a separate step prior to thermal treating of the photosensitive element. Actinic radiation of any origin and type can be used in the photopolymerization process, and preferably is ultraviolet radiation. Actinic radiation sources encompass the ultraviolet and visible wavelength regions. The suitability of a particular actinic radiation source is governed by the photosensitivity of the initiator and the at least one monomer used in preparing the flexographic printing plates. The preferred photosensitivity of most common flexographic printing plates are in the UV and deep UV area of the spectrum, as they afford better room-light stability. The radiation can emanate from point sources or be in the form of parallel rays or divergent beams. Examples of suitable visible or ultraviolet sources include carbon arcs, mercury-vapor arcs, fluorescent lamps, electron flash units, electron beam units, and photographic flood lamps. The most suitable sources of ultraviolet radiation are fluorescent lamps and the mercury-vapor lamps, particularly sun lamps. These radiation sources generally emit long-wave UV radiation between 310-400 nm.

The actinic radiation exposure time can very from a few seconds to minutes, depending upon the intensity and spectral energy distribution of the radiation, its distance from the photosensitive element, and the nature and amount of the composition of the photopolymerizable layer. Exposure temperatures are preferably ambient or slightly higher, i.e., about 20° C. to about 45° C.

Imagewise exposure of the photosensitive element to actinic radiation may be conducted in the presence or absence of atmospheric oxygen for photosensitive elements having an in situ mask. Atmospheric oxygen is eliminated when the exposure is conducted in a vacuum. The exposure may be conducted in a vacuum to minimize the effects of oxygen on the polymerization reactions occurring in that layer. And for photosensitive elements that are exposed through an image transparency, the exposure must be conducted in vacuum to assure good contact between the image transparency and the photosensitive element.

The process of the invention may also include a back exposure or backflash step. This is a blanket exposure to actinic radiation through the support. It is used to create a shallow layer of polymerized material, or a floor, on the support side of the photopolymerizable layer and to sensitize the photo-polymerizable layer. The floor provides improved adhesion between the photopolymerizable layer and the support and establishes the depth of relief for the plate. The backflash exposure can take place before, after, or during the other imaging step. Generally, it is preferred that the backflash exposure takes place just prior to the imagewise exposure. However, for photosensitive elements exposed through a phototool and thermally treated, it is preferred that the backflash exposure takes place after imagewise exposure. Any of the conventional radiation sources discussed above can be used for the backflash exposure step. Backflash time generally ranges from a few seconds up to about a few minutes.

The imagewise exposed photosensitive element is then ready for the next step of the present process which is thermally treating the exposed element to develop the relief image or pattern. Thermally treating the element includes heating the exposed photopolymerizable layer at a temperature sufficient to cause the unexposed (uncured) portions of the element to soften or melt or flow, and contacting the layer to an absorbent surface to absorb the melt or flow portions.

The term "melt" is used to describe the behavior of the unirradiated portions of the photopolymerizable elastomeric layer subjected to an elevated temperature that softens and reduces the viscosity to permit absorption by the absorbent material. The material of the meltable portion of the photopolymerizable layer is usually a viscoelastic material which does not have a sharp transition between a solid and a liquid, so the process functions to absorb the heated composition layer at any temperature above some threshold for absorption in the absorbent material. A wide temperature range may be utilized to "melt" the composition layer for the purposes of this invention. Absorption may be slower at lower temperatures and faster at higher temperatures during successful operation of the process.

The thermal treating steps of heating the photopolymerizable elastomeric layer and contacting the layer with an absorbent material can be done at the same time, or in sequence provided that the uncured portions of the photopolymerizable elastomeric layer are still soft or in a melt state when contacted with the absorbent material. The photopolymerizable elastomeric layer is heated by conduction, convection, radiation, or other heating methods to a temperature sufficient to effect melting of the uncured portions but not so high as to effect distortion of the cured portions of the layer. The photopolymerizable layer is heated to a surface temperature from about 40° C. to about 200° C. (104-392° F.), preferably from 100 to 160° C. in order to effect melting or flowing of the uncured portions. The absorbent material contacts the surface of the photopolymerizable elastomeric layer of the heated photosensitive element, and absorbs the softened or molten or flowing portions of the elastomeric layer from the unirradiated portions, forming a flexographic printing plate in which the uncured portions are removed to form a relief pattern or surface. By maintaining more or less intimate contact of the absorbent material with the photopolymerizable elastomeric layer that is molten in the uncured regions, a transfer of the uncured photosensitive material from the photopolymerizable layer to the absorbent material takes place. While still in the heated condition, the absorbent material is separated from the cured elastomeric layer in contact with the support layer to reveal the relief structure. A cycle of the steps of heating the photopolymerizable elastomeric layer and contacting the molten (portions) layer with an absorbent material can be repeated as many times as necessary to adequately remove the uncured material and create sufficient relief depth. However, it is desirable to minimize the number of cycles for suitable system performance, typically the photopolymerizable element is thermally treated for 5 to 15 cycles.

A preferred apparatus to thermally develop the photosensitive element is disclosed by Peterson et al. in U.S. Pat. No. 5,279,697, and also by Johnson et al. in Patent Cooperation Treaty PCT Publication No. WO 01/18604 A2 published Mar. 5, 2001. The photosensitive element may be placed on a drum or a planar surface in order for thermal treatment to be carried out.

The absorbent material is selected having a melt temperature exceeding the melt temperature of the unirradiated or uncured portions of the radiation curable composition and having good tear resistance at the same operating temperatures. Preferably, the selected material withstands temperatures required to process the photosensitive element during heating. The absorbent material is selected from non-woven materials, paper stocks, fibrous woven material, open-celled foam materials, porous materials that contain more or less a substantial fraction of their included volume as void volume.

The absorbent material can be in web or sheet form. Preferred absorbent materials utilized to remove the uncured portions of the elastomeric layer from the cured portions of the layer are selected from absorbent materials which possess internal strength and tear resistance to temperatures up to, including and slightly beyond the melting temperature of the uncured photopolymerizable material. The absorbent materials should also possess a high absorbency for the molten elastomeric composition. Preferred is a non-woven nylon web.

Intimate contact of the absorbent material to the photopolymerizable layer (while in the uncured portions are melt) may be maintained by the pressing the layer and the absorbent material together. It is desirable to apply a substantially uniform pressure of between about 2.11 kilograms per square centimeter and about 4.92 kilograms per square centimeter, with a preferred pressure of about 3.16 kilograms per square centimeter during processing. Pressure is applied to force the absorbent material into intimate contact with the photopolymerizable layer. It is believed that between about 0.70 kilograms per square centimeter and about 7.03 kilograms per square centimeter in a nip of the area in contact is adequate to enhance the absorption from the layer surface to the absorbent material without distorting the relief features on the photosensitive element.

Most flexographic printing plates are uniformly post-exposed to ensure that the photopolymerization process is complete and that the plate will remain stable during printing and storage. This post-exposure step utilizes the same radiation source as the main exposure.

Detackification (light finishing) is an optional post-development treatment that can be applied if the surface is still tacky, such tackiness not generally being removed by post exposure.

EXAMPLES

Test Methods

Melt Flow Index Measurement

The melt flow index (MFI) was determined with a Zwick 4100 Fliessprüfgerät instrument (by Zwick Roell, Ulm, Germany). The instrument was set so that the weight used was 2.16 kg and the orifice size was 0.0825 inch (2.0955 mm). Small samples (in total ca. 8 grams) of photopolymerizable material were heated to 140° C. and pressed through the orifice. The amount of material from the orifice in specific time intervals was weighed and calculated to the unit of g/10 minutes.

Slope of G' Measurement

Measurement Device:

A Paar Physica dynamical mechanical spectrometer (model Rheolab MC 120) (by Paar Instrument, Stuttgart, Germany was used in parallel-plate geometry for the dynamical mechanical measurements. Frequency sweeps from 0.03 to 50 Hz were run at a temperature of 140° C.±2° C. The plate diameter used was 30 mm (MP 30). The experiments were conducted with constant stress and a torque amplitude of 5 milliNewton-meter. The linear regression analysis of the data was conducted on a log-log plot between the frequencies of 1.6 to 50 Hz.

Sample Preparation:

For measurement, a 1 mm thick photopolymerizable elastomeric layer was pressed between two layers of silicone coated MYLAR® one of which was removed prior to exposure of the layer to actinic radiation. Prior to dynamic measurement, the other silicone coated Mylar® was removed. The sample was compressed in the rheometer to obtain good thermal contact and minimize slippage.

Exposure:

All plates were exposed on a CYREL® 1002 exposure unit. The plates were exposed through a UV filter for a period of about 8 minutes. The resulting UV energy of the exposure was 800 mJ/cm$^2$.

Note that all photosensitive elements which were exposed and thermally developed to form a relief in the following examples were 0.067 inch thick (1.7 mm). In the following examples, all percentages are by weight unless otherwise noted.

Example 1

A photopolymerizable composition of the following ingredients were mixed, extruded and calendered to form a layer between a support and a coversheet to form a photosensitive element for flexographic printing. The photopolymerizable elastomeric layer was composed of (by weight based upon the elastomeric composition): 35% of a thermoplastic elastomeric binder (a poly (styrene/isoprene/styrene) block copolymer having a vinyl content of about 55% of the total number of double bonds in the elastomeric mid-block; 38% of a second thermoplastic elastomeric binder (a poly (styrene/isoprene/styrene) block copolymer having a diblock content of about 40% by weight based on the weight of the binder; 12% of polybutadiene oil (number ave. molecular weight of 1100-1250); 5% hexamethyldiol diacrylate; 2.7% hexamethyldioldimethacrylate; 4.1% of ethoxylated [4]nonylphenol acrylate (from Sartomer, Philadelphia, Pa.); 2.4% Irgacure 651 (2,2 dimethyloxy-2-phenylacetophenone from Ciba, Geneva, Switzerland); and the remainder were additives including an antioxidant, thermal inhibitor, and a dye.

The release layer of Macromelt® polyamide was on the coversheet, but remained with the photopolymerizable layer when the coversheet was removed.

Separate samples of the photopolymerizable material were tested according to the procedures described above for melt flow index and the slope of G'. The melt flow index at 140° C., using a 2.16 kg force of the photo-polymerizable layer was 10.6 g/10 minutes. The slope of G' as a function of frequency at 140° C. was 0.12±0.02.

The photosensitive element was exposed with the CYREL® 1002 exposure unit applying first a back exposure of 50 seconds and secondly a main exposure of 12 minutes. A negative with 150 lines per inch was used as a mask for the main exposure.

The exposed element was then thermally treated in a thermal processor similar to the processor described by Peterson et al. in U.S. Pat. No. 5,279,697. The processor used for these experiments was modified to include an IR heater with a maximum power of 5200 W to heat an outer surface of the photopolymerizable layer. The processor further included cooling with air of the photopolymerizable layer after separation of the absorbent material from the photopolymerizable layer. For these tests, the IR heater was run at 30-40% of its maximum output, with drum speeds from 30-40 inch/min (76.2-101.6 cm/minute). Plates were processed for 12 cycles of heating and contacting. Processor conditions were adjusted from one cycle to the next, but all examples cited used the same sequence of processing conditions. The temperature of the developer roll was 300° F.

(148.9° C.). The temperature of the drum was 100° F. (37.8° C.). The pressure associated with contacting the element to the absorbent material (drum to developer roll) was 30-60 psi on the cylinders. The cooling blowers were on. The exposed element was placed and clamped to the heated drum and rotated by the drum through 12 cycles of heating the photopolymerizable layer, contacting the layer with a web of an absorbent material, separating the absorbent material from the layer, and cooling the layer. The absorbent material was CEREX® non-woven nylon web, type 2320 (from Cerex Advanced Fabrics, Pensacola, Fla.).

The plate formed a relief of 0.92 mm (0.036 inch). After 12 passes (cycles) a deep relief was formed. The visual appearance of the plate was very good, showing a uniform floor throughout the plate. Microscopical inspection revealed a very good retention of very fine printing elements like highlight dots (1%, 2% dots) and fine lines. No plastic deformations of these fine features were observed. Additionally a sharp resolution could be detected under the microscope. Moreover the measurement of the reverse lines (0.8 mm negative line) showed that deep reverses (330 to 400 μm) were obtained by thermal development of the photosensitive element.

Comparative Example 1A

A CYREL® flexographic printing plate, type PLS, sold by E. I. du Pont de Nemours and Company (Wilmington, Del.) was tested and evaluated for performance in a thermal development process.

Separate samples of the plate were tested according to the procedures described above for melt flow index and the slope of G'. The melt flow index at 140° C., using a 2.16 kg force of the photopolymerizable layer was 1.2 grams/10 minutes. The slope of G' as a function of frequency at 140° C. was 0.19±0.02 .The plate was exposed to provide a suitable relief image so that the plate was exposed for 10 seconds for backflash and for 12 minutes for the main exposure. (If the exposure conditions of Example 1 were used for the plate of Comparative Example 1A, the plate would have been overexposed.) The exposed plate was then process under the same conditions as described in Example 1.

The plate formed a relief of 0.65 mm (0.025 inch). The visual inspection showed distortion of the 1% highlight dots, overall poor resolution, and shallow reverse lines (0.8 mm negative line: 130-150 μm).

Comparative Example 1B

A CYREL® flexographic printing plate, type NOW, sold by E. I. du Pont de Nemours and Company (Wilmington, Del.) was tested and evaluated for performance in a thermal development process.

Separate samples of the plate were tested according to the procedures described above for melt flow index and the slope of G'. The melt flow index of the photopolymerizable layer at 140° C., using a 2.16 kg force was less than 1.0 gram/10 minutes. The slope of G' as a function of frequency at 140° C. was 0.11±0.02. The plate was exposed and processed under the same conditions as described above for Example 1. The plate formed a relief of 0.73 mm (0.028 inch). Visual inspection showed good retention of the highlight dots, but no deep reverses (190-210 μm). However the resolution, especially regarding fine printing elements, was not satisfactory.

Comparative Example 1C

A photopolymerizable composition of the following ingredients were mixed, extruded and calendered to form a layer between a support and a coversheet to form a photosensitive element for flexographic printing. The photopolymerizable elastomeric layer was composed of (by weight based upon the elastomeric composition): 35% of a thermoplastic elastomeric binder (a poly (styrene/isoprene/styrene) block copolymer of number average molecular weight of 146,000 g/mol (determined by GPC, tetrahydrofurane, polystyrene as calibration) and with 15% styrene and 17% diblock; 32% of a second thermoplastic elastomeric binder (a poly (styrene/isoprene/styrene) block copolymer of number average molecular weight of 89,000 g/mol (determined by GPC, tetrahydrofurane, polystyrene as calibration) containing approximately 45% styrene and no diblock component; 12% of polybutadiene oil (number ave. molecular weight of 1100-1250); 5% hexamethyldiol diacrylate; 2.7% hexamethyldioldimethacrylate; 4.1% of ethoxylated [4]nonylphenol acrylate (from Sartomer, Philadelphia, Pa.); 2.4% Irgacure 651 (2,2 dimethyloxy-2-phenylacetophenone from Ciba, Geneva, Switzerland); and the remainder were additives including an antioxidant, thermal inhibitor, and a dye.

Separate samples of the plate were tested according to the procedures described above for melt flow index and the slope of G'. The melt flow index of the photopolymerizable layer at 140° C., using a 2.16 kg force was less than 12.0 grams/10 minutes. The slope of G' as a function of frequency at 140° C. was 0.22±0.02 .The plate was exposed and processed under the same conditions as described above for Example 1 . The plate developed a relief of 1.0 mm (0.040 in) and had deep reverses (0.8 mm negative line: 360-380 μm). However, visual inspection revealed the fine highlight dots were badly distorted or broken off and fine lines were distorted and wavy.

Example 2 and Comparative Examples 2A through 2C

The following Example 2 and Comparative Examples 2A, 2B and 2C demonstrate the usefulness of the photosensitive element in less severe conditions for thermal processing. The photosensitive elements of Example 1 and Comparative Examples 1A through 1C were exposed and processed as described above with the exception that the processing conditions for thermal development were different.

The elements in Example 1 and Comparative Examples 1A through 1C were exposed under the same conditions as described in Examples 1-1C and then thermally treated in a thermal processor similar to as the processor described by Peterson et al. in U.S. Pat. No. 5,279,697 with the modifications, i.e., IR heating, and cooling, as described in Example 1 above. For these tests, milder processing conditions were used, i.e. the IR heater was run at 25% of its maximum output, the drum speed at 30 inch/min (76.2 cm/minute), and plates were processed for only 6 cycles of heating and contacting. Again all 4 plates were processed with the same conditions. The temperature of the developer roll was 300° F. (148.9° C.). The temperature of the drum was 100° F. (37.8° C.). The pressure associated with contacting the element to the absorbent material (drum to developer roll) was 40 psi on the cylinders. The cooling blowers were on.

The photosensitive element of Example 1 above processed well forming a relief of 0.61 mm (0.024 inch). The visual appearance was very good with the fine printing elements undistorted. Measurement of the 0.8 mm reverse line showed a depth of 380-470 μm.

Comparative Example 2A

A Cyrel® flexographic printing plate, type PLS, was produced using the milder developing conditions of Example 2 . Relief of 0.38 mm (0.015 inch) was developed which was much less than the relief formed in Example 2. Fine features were somewhat distorted with many of the 1% dots being irregular in shape and spacing. Measurement of the 0.8 mm reverse line showed a depth of 160-165 μm, again significantly less than in Example 2.

Comparative Example 2B

A Cyrel® flexographic printing plate, type NOW, was produced using the milder developing conditions of Example 2 . Relief of 0.35 mm (0.014 inch) was developed. Fine features were maintained intact, but measurement of the 0.8 mm reverse line showed a depth of 235-250 μm, less than the depth measured in Example 2.

Comparative Example 2C

The photosensitive element of Comparative Example 1C was processed under the same conditions as described in Example 2. The plate developed a relief of 0.60 mm (0.0235 inch) and had deep reverses (0.8 mm reverse line 396-410 μm), comparable to but slightly less than Example 2. However, unlike Example 2, visual inspection revealed badly distorted fine highlight dots and slight bending of fine lines.

In the preceding examples, one can see that formulations with a melt flow index above 4 grams/10 minutes and a slope of G' less than 0.18 are capable of reproducing fine image elements while developing deeper relief than at other materials processed under similar conditions. Viewed from another perspective (i.e., comparing Example 2 and Comparative Example 1A), these materials can also be seen to develop similar relief when processed under milder conditions than materials traditionally used for flexographic plates.

Example 3 and Comparative Example 3A-3C

The following Example 3 and Comparative Examples 3A-3C demonstrate the criticality of the slope of the dynamic storage modulus (G') versus frequency (f) to be less than 0.20 for a photopolymerizable layer of a photosensitive element in the process of this invention in which the photosensitive element is imagewise exposed through an in-situ mask (formed digitally with laser radiation) and thermally developed.

In Example 3 and Comparative Examples 3A-3C, all the photosensitive elements included an infrared-sensitive, actinic radiation opaque layer disposed above the photopolymerizable layer. After the element was back exposed (through the support) for the time indicated in the example, the infrared-sensitive, actinic radiation opaque layer was imagewise removed from the element to form an in-situ mask with infrared laser radiation from a CYREL® Digital Imager. The in situ mask image created on the element was a 150 line per inch screen test target. All elements were imaged similarly. Once the digital imaging was completed, the elements were imagewise exposed through the digitally created mask for 8 minutes on a CYREL 1002E exposure unit (1450mJ/cm$^2$/min).

The elements of Example 3 and Comparative Example 3A-3C were imaged and processed in a thermal processor similar to that described in Example 1 except that the IR heater with a maximum power of 3600W was used. For these tests, the IR heater was run at 50-80% of its maximum output, with drum speeds from 20-40 inch/min (50.8-101.6 cm/minute). Elements were processed for 12 cycles of heating and contacting. Processor conditions were adjusted from one cycle to the next, but all examples cited (3, 3A-3C) used the same sequence of processing conditions. The temperature of the developer roll was 320° F. (160° C.). The temperature of the drum was 100° F. (38° C.). The pressure associated with contacting the element to the absorbent material (drum to developer roll) was 30-50 psi on the cylinders. The cooling blowers were off. The exposed element was placed and clamped to the heated drum and rotated by the drum through 12 cycles of heating the photopolymerizable layer, contacting the layer with a web of an absorbent material, separating the absorbent material from the layer, and cooling the layer. The absorbent material was CEREX® non-woven nylon web, type 2320.

Example 3

The photosensitive element of Example 1 was laminated with a second element having a 2.5 to 3 micron (25-30 mg/dm$^2$) coating of the actinic radiation opaque layer comprising 67% Macromelt® polyamide and 33% carbon black dispersion, so that the radiation opaque layer was adjacent the photopolymerizable layer of the photosensitive element. The element was exposed through the back for 60 seconds, digitally imaged, imagewise exposed, and thermally treated as described above to form a plate. The elastomeric layer had a slope of G' of 0.12±0.02 and a melt flow index of 10.6 g/10 min. (the same as in Example 1).

The plate formed a relief of 0.58 mm (0.023 inch). The visual appearance of the plate was very good, showing a uniform floor throughout the plate. Microscopic inspection revealed a very good retention of very fine printing elements like highlight dots (1%, 2% dots) and fine lines. No plastic deformations of these fine features were observed. Additionally a sharp resolution could be detected under the microscope. Moreover the measurement of the reverse lines (0.8 mm negative line) showed that deep reverses (350 to 400 microns) were obtained by thermal development of the photosensitive element.

Comparative Example 3A

A Cyrel® flexographic printing plate, type DPS, was digitally imaged and produced under the same conditions as in Example 3 except that the backflash exposure was 23 seconds. (The DPS plate included the infrared-sensitive, actinic radiation opaque layer as described Example 3 disposed above the photopolymerizable layer.) The melt flow index and slope of G' are identical to those for PLS in Comparative Example 1A. Relief of 0.51 mm (0.020 inch) was developed though many of the 1% dots were irregular in shape and badly bent. Measurement of the 0.8 mm reverse line showed a depth of 315 micron, much deeper than Comparative Examples 1A and 2A from the analog workflow. Since the highlight dots are the only features that appear distorted, this plate was deemed marginally acceptable for print jobs requiring 1% dots at 150 lines/inch (60 lines/cm) resolution. Such a plate defines the boundary of acceptable performance in the thermal process and forms the basis for setting the upper bound for an acceptable slope of G' at 0.2 for digital workflow.

Comparative Example 3B

A Cyrel® flexographic printing plate, type NOW, was laminated with the second element carrying the actinic radiation opaque layer as described in Example 3, and then digitally imaged and produced using the conditions of Example 3. The back exposure prior to laser imaging was 50 seconds. The elastomeric layer had a slope of G' of 0.11±0.02 and a melt flow index of less than 1 g/10 min.

Relief of 0.53 mm (0.021 inch) was developed. Fine features (1% and 2% dots, fine lines) were maintained intact, and measurement of the 0.8 mm reverse line showed a depth of 290 μm, again much deeper than this material in the analog workflow as shown in Comparative Examples 1B and 2B.

Comparative Example 3C

The photosensitive element of Comparative Example 1C was laminated with the second element carrying the actinic radiation opaque layer as described in Example 3, and then digitally imaged and processed under the same conditions as described in Example 3. The back exposure prior to laser imaging was 45 seconds. The melt flow index and slope of G' were identical to those for the elastomeric layer tested in Comparative Example 1C.

The plate developed a relief of 0.53 mm (0.021 inch) and had deep reverses (0.8 mm reverse line 380-415 μm), comparable to but slightly less than Example 3. However, unlike Example 3, visual inspection revealed badly distorted fine highlight dots and slight bending of fine lines.

In the preceeding examples, one can see that for photosensitive elements which are thermally processed, the limitations of the melt flow index and the slope of G' for the elastomeric layer can be adjusted to accommodate the influence that the kind of imagewise exposure, i.e., analog or digital, has on the relief and printing features of the printing plate. For analog workflow, i.e., imagewise exposure through a phototool, elastomeric layers with a melt flow index above 4 grams/10 minutes and a slope of G' less than 0.18 are capable of reproducing fine image elements while developing deeper relief than are other materials processed under similar conditions. For the digital workflow, i.e., imagewise exposure through the in-situ mask, the requirement on the melt flow index can be relaxed as even photosensitive elements with relatively low melt flow indices develop good relief and clean print features and the slope of G' can be as high as 0.20.

What is claimed is:

1. A process for producing a flexographic printing plate comprising:
    i) providing a photosensitive element comprising
        a) a support;
        b) at least one photopolymerizable elastomeric layer on the support having a composition comprising at least one thermoplastic binder; at least one compound capable of addition polymerization; and a photoinitiator; wherein the layer has a melt flow index of at least 4 grams/10 min. under a 2.16 kilogram weight at 140° C., and wherein the layer when exposed to actinic radiation to determine a log-log plot of the dynamic storage modulus (G') versus frequency (f), exhibits a slope of less than 0.18;
    ii) imagewise exposing the element to actinic radiation to polymerize areas exposed to radiation; and
    iii) thermally treating the element of ii) to remove unpolymerized material from the element and form a relief surface.

2. The process of claim 1 wherein the thermally treating step comprises:
    iiia) heating the element of ii) to temperature between 40 and 200° C.; and
    iiib) contacting the element with an absorbent material to remove unpolymerized material from the element.

3. The process of claim 2 further comprising:
    iiic) applying substantially uniform pressure of between 2.11 kilograms per square centimeter to about 4.92 kilograms per square centimeter while the element and the absorbent material are in contact.

4. The process of claim 2 wherein after the contacting step iiib) further comprising:
    separating the element from the absorbent material.

5. The process of claim 2 wherein the heating step iiia) and the contacting step iiib) are repeated 2 or more times.

6. The process according to claim 1 wherein the photopolymerizable elastomeric layer has a melt flow index of at least 5 grams/10 min.

7. The process according to claim 1 wherein the photopolymerizable elastomeric layer has a melt flow index of at least 7.5 grams/10 min.

8. The process according to claim 1 wherein the photopolymerizable elastomeric layer has a melt flow index of at least 5 grams/10 min., and wherein the log-log plot has a linear slope of less than 0.16.

9. The process according to claim 1 wherein the photopolymerizable elastomeric layer has a melt flow index greater than 10 grams/10 min., and wherein the log-log plot has a linear slope of less than 0.14.

10. The process according to claim 1 wherein the log-log plot of the photopolymerizable layer is determined by exposing 1 mm thick layer with 600 to 1000 mJoules/cm$^2$ of actinic radiation.

11. The process according to claim 1 wherein the log-log plot of the photopolymerizable layer is determined by exposing the photopolymerizable layer of 1 mm thickness with 800 mjoules cm$^2$ of actinic radiation.

12. The process according to claim 1 wherein the log-log plot of the photopolymerizable layer is determined by exposure to radiation having a wavelength of 340 to 380 nm.

13. The process according to claim 1 wherein the thermoplastic binder is elastomeric.

14. A process for producing a flexographic printing plate comprising:
    i) providing a photosensitive element comprising
        a) a support;
        b) at least one photopolymerizable elastomeric layer on the support having a composition comprising at least one thermoplastic binder; at least one compound capable of addition polymerization; and a photoinitiator; wherein the layer when exposed to actinic radiation to determine a log-log plot of the dynamic storage modulus (G') versus frequency (f), exhibits a slope of less than 0.20;
    ii) imagewise exposing the photopolymerizable layer to actinic radiation through an in-situ mask in the presence of atmospheric oxygen to polymerize areas exposed to radiation; and
    iii) thermally treating the element of ii) to remove unpolymerized material from the element and form a relief surface.

15. The process of claim 14 wherein the photopolymerizable layer has a melt flow index of at least 0.5 grams/10 min. under a 2.16 kilogram weight at 140° C.

16. The process of claim 14 wherein the photopolymerizable layer has a melt flow index between 1.5 to 4.0 grams/10 min. under a 2.16 kilogram weight at 140° C.

17. The process of claim 14 further comprising forming the in-situ mask with digital information.

18. The process of claim 14 wherein the photosensitive element further comprises an actinic radiation opaque layer having sensitivity to infrared radiation, and forming the in-situ mask is by imagewise ablating the actinic radiation opaque layer with infrared laser radiation.

19. The process of claim 14 wherein the photosensitive element forms an assemblage with a second element having at least an actinic radiation opaque layer having sensitivity to infrared radiation, wherein the actinic radiation opaque layer is adjacent the photopolymerizable elastomeric layer, and forming the in-situ mask is by imagwise transfer of the actinic radiation opaque layer with infrared laser radiation to the photosensitive element.

20. The process of claim 14 further comprising forming the in-situ mask on a surface of the element opposite the support with ink jet methods.

21. The process of claim 14 wherein the thermally treating step comprises:
   iiia) heating the element of ii) to temperature between 40 and 200° C.; and
   iiib) contacting the element with an absorbent material to remove unpolymerized material from the element.

22. The process of claim 21 further comprising:
   iiic) applying substantially uniform pressure of between 2.11 kilograms per square centimeter to about 4.92 kilograms per square centimeter while the element and the absorbent material are in contact.

23. The process of claim 21 wherein after the contacting step iiib) further comprising:
   separating the element from the absorbent material.

24. The process of claim 21 wherein the heating step iiia) and the contacting step iiib) are repeated 2 or more times.

25. The process according to claim 14 wherein the log-log plot of the photopolymerizable layer is determined by exposing 1 mm thick layer with 600 to 1000 mJoules/cm$^2$ of actinic radiation.

26. The process according to claim 14 wherein the log-log plot of the photopolymerizable layer is determined by exposing the photopolymerizable layer of 1 mm thickness with 800 mJoules/cm$^2$ of actinic radiation.

27. The process according to claim 14 wherein the log-log plot of the photopolymerizable layer is determined by exposure to radiation having a wavelength of 340 to 380 nm.

28. The process according to claim 14 wherein the log-log plot of the dynamic storage modulus (G') versus frequency (f), exhibits a slope of less than 0.18.

29. The process according to claim 1 further comprising backflash exposing the photopolymerizable elastomeric layer through the support.

30. The process according to claim 29 wherein backflash exposing occurs after the imagewise exposing step ii).

31. The process according to claim 1 wherein imagewise exposing is through a phototool.

32. The process of claim 14 wherein the thermally treating step includes shear force, distortion, or shear force and distortion, on the relief surface.

33. The process of claim 1 wherein the thermally treating step includes shear force, distortion, or shear force and distortion, on the relief surface.

34. The process of claim 1 wherein the photosensitive element is in sheet form or cylindrical form.

35. A process for producing a flexographic printing form comprising:
   i) providing a photosensitive element comprising at least one photopolymerizable elastomeric layer having a composition comprising at least one thermoplastic binder; at least one compound capable of addition polymerization; and a photoinitiator; wherein the layer has a melt flow index of at least 4 grams/10 min. under a 2.16 kilogram weight at 140° C., and wherein the layer when exposed to actinic radiation to determine a log-log plot of the dynamic storage modulus (G') versus frequency (f), exhibits a slope of less than 0.18;
   ii) imagewise exposing the element to actinic radiation to polymerize areas exposed to radiation; and
   iii) thermally treating the element to cause unpolymerized material to soften or melt or flow and form a relief surface.

36. The process of claim 35 further comprising removing the unpolymerized material that soften or melt or flow.

37. The process of claim 35 wherein the photopolymerizable elastomeric layer is on a support selected from the group consisting of a sheet and a cylinder.

* * * * *

UNITED STATES PATENT AND TRADEMARK OFFICE
CERTIFICATE OF CORRECTION

PATENT NO. : 7,348,123 B2  Page 1 of 1
APPLICATION NO. : 11/580666
DATED : March 25, 2008
INVENTOR(S) : Christoph Mengel et al.

It is certified that error appears in the above-identified patent and that said Letters Patent is hereby corrected as shown below:

Col. 20, line 42; in Claim 11, line 4, please change "mjoules cm2" to read -- mJoules/cm2 --.

Signed and Sealed this

Fifteenth Day of July, 2008

JON W. DUDAS
*Director of the United States Patent and Trademark Office*